US00RE34025E

United States Patent [19]

Takagi et al.

[11] E Patent Number: Re. 34,025

[45] Reissued Date of Patent: Aug. 11, 1992

[54] SEMICONDUCTOR DEVICE WITH ISOLATION BETWEEN MOSFET AND CONTROL CIRCUIT

[75] Inventors: Yosuke Takagi, Yokohama; Yu Ohata, Tokyo; Koichi Kitahara, Kawasaki; Tsuyoshi Kuramoto, Yokohama, all of Japan

[73] Assignee: Kabushiki Kaisha Toshiba, Kawasaki, Japan

[21] Appl. No.: 620,536

[22] Filed: Nov. 28, 1990

Related U.S. Patent Documents

Reissue of:

[64] Patent No.: 4,879,584
Issued: Nov. 7, 1989
Appl. No.: 154,275
Filed: Feb. 10, 1988

[30] Foreign Application Priority Data

Feb. 13, 1987 [JP] Japan ..... 62-29553

[51] Int. Cl.[5] ..... H01L 27/02

[52] U.S. Cl. ..... 357/43; 357/41; 357/42; 357/48; 357/47; 357/23.4

[58] Field of Search ..... 357/43, 23.4, 42, 58, 357/40, 41, 37, 48, 47

[56] References Cited

U.S. PATENT DOCUMENTS

| | | | |
|---|---|---|---|
| 4,046,605 | 9/1977 | Nelson et al. | 148/175 |
| 4,376,286 | 3/1983 | Lidow et al. | 357/23.4 |
| 4,546,370 | 10/1985 | Curran | 357/43 |
| 4,609,413 | 9/1986 | Boland | 148/175 |
| 4,980,744 | 12/1990 | Watanabe et al. | 357/43 X |
| 5,001,073 | 3/1991 | Huie | 357/43 X |
| 5,045,900 | 9/1991 | Tamagawa | 357/48 X |

FOREIGN PATENT DOCUMENTS

| | | | |
|---|---|---|---|
| 57-42164 | 3/1982 | Japan | 357/23.4 |
| 58-206153 | 12/1983 | Japan . | |
| 59-47757 | 3/1984 | Japan | 357/43 |
| 63-104468 | 5/1988 | Japan | 357/43 |
| 2186117 | 8/1987 | United Kingdom | 357/43 |

OTHER PUBLICATIONS

Fischetti, "In Smarter Design and Fabrication of ICs, Power and Logic are Mixed on the Same Chip and Circuits are Integrated Over an Entire Wafer," *IEEE Spectrum*, No. 1, pp. 60–64, Jan. 1985.

Patent Abstracts of Japan, vol. 8, No. 53, (E-231)[1490], Mar. 3, 1984 & JP-A-58 206 153, (Daini Seikosha K.K.), Jan. 12, 1983.

Fischetti, "Solid-State", *IEEE Spectrum*, vol. 22, No. 1, Jan. 1985, pp. 60–64.

Sutor et al., "A Novel Isolation Structure for SMART-power ICs", *IEDM*, Dec. 9, 1986, pp. 214–217.

Schultz et al., "Mixed MOS Devices Unite in a Switch Chip that Links Power with Smarts", *Electronic Design*, Feb. 21, 1985, pp. 191–198.

*Primary Examiner*—William Mintel

*Attorney, Agent, or Firm*—Finnegan, Henderson, Farabow, Garrett and Dunner

[57] ABSTRACT

A semiconductor device is provided which has a power insulated-gate MOS field effect transistor and a control semiconductor element formed in a common semiconductor substrate. A first area corresponding to a drain region of low resistance in the power MOS field effect transistor is different in resistivity than a second area corresponding to the control semiconductor element. The electrical characteristics of each element integrated in the devices is substantially equal to the same element in discrete form.

20 Claims, 7 Drawing Sheets

FIG. 6(b)
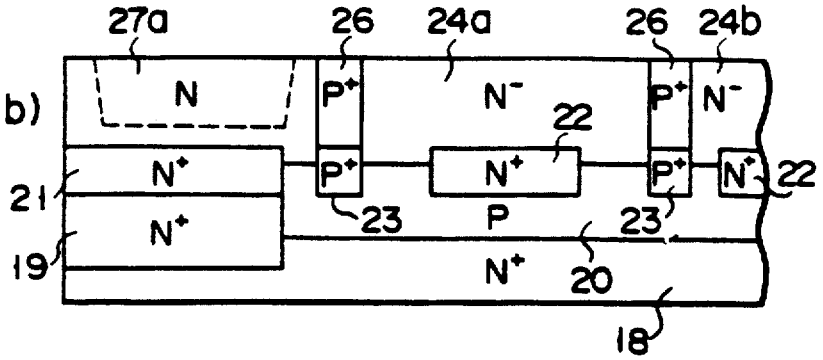
FIG. 7(a)
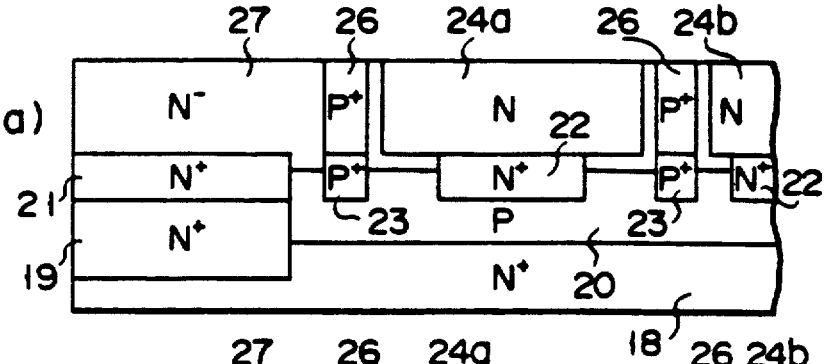
FIG. 7(b)
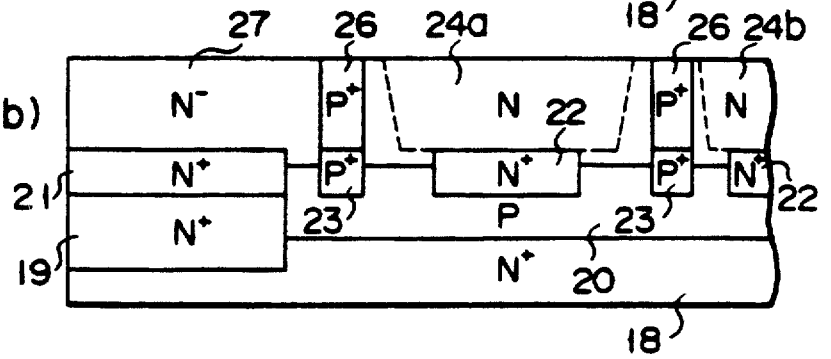
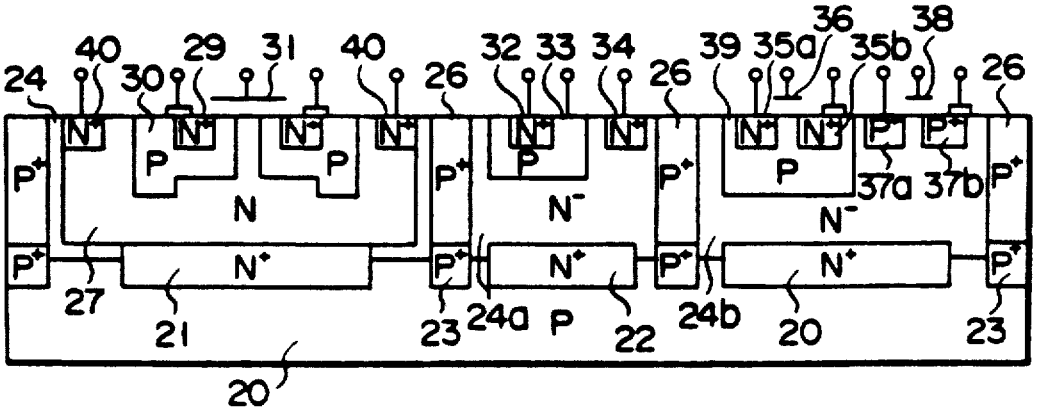
FIG. 8(a)

SEMICONDUCTOR DEVICE WITH ISOLATION BETWEEN MOSFET AND CONTROL CIRCUIT

Matter enclosed in heavy brackets [ ] appears in the original patent but forms no part of this reissue specification; matter printed in italics indicates the additions made by reissue.

*This is an Application for reissue of U.S. Pat. No. 4,879,584 issued Nov. 7, 1989 entitled "Semiconductor Device With Isolation Between MOSFET And Control Circuit".*

BACKGROUND OF THE INVENTION

1. Field of the Invention

The present invention relates to a semiconductor device which is manufactured by monolithically integrating a Power MOS FET, that is a power insulated-gate type FET having a drain region of high resistance, and a small-signal semiconductor or control transistor element in a single semiconductor substrate in which the small-signal semiconductor element is employed for controlling the Power MOS FET.

2. Description of the related art including information disclosed under 1.97-1.99

An explanation will be given below of one conventional form of a composite semiconductor device manufactured by monolithically integrating in a single semiconductor substrate a Power MOS FET having a drain region of high resistance, NPN transistor; and MOS transistor. FIG. 1 is a cross-sectional view showing a semiconductor device. A Power MOS FET will be explained below by way of example. The semiconductor device as shown in FIG. 1 includes $N^+$ drain regions 1, 2 having a low resistance, an $N^-$ type drain area 3 having a high resistance, a P type body 4, an $N^+$ type source region 5 and a gate electrode 6. An NPN transistor will be explained below in connection with the semiconductor device shown in FIG. 1. The semiconductor device further includes an $N^+$ type collector region 7 having a low resistance, an $N^-$ type collector area 8a having a high resistance, a P type base 9, an $N^+$ type emitter 10 and an $N^+$ type collector region 11 from which a collector current is taken out for external connection.

A CMOS transistor will now be given below in connection with the semiconductor device shown in FIG. 1. The semiconductor device further includes a CMOS transistor having an $N^-$ type area 8b, a $P^-$ type well 12, and $N^+$ drain region 13a and an $N^+$ type source region 13b of an N channel MOS FET within $P^-$ type well 12, gate a electrode 15 of an N-channel type MOS FET, $P^+$ type drain region 14a and $P^+$ type source region 14b of an FET and gate electrode 16 of a P channel MOS FET. $P^+$ type regions 17a and $P^+$ type region 17b provide an electrical isolation, by PN junction isolation method, among the Power MOS FET, NPN transistor and C-MOS transistor.

According to the conventional technique, drain area 3 having a high resistance in the Power MOS FET, $N^-$ collector area 8a having a high resistance in the NPN transistor and area 8b in the CMOS FET transistor are simultaneously formed in the semiconductor substrate by an epitaxial growth method. In this way, these regions have the same resistivity, but an optimum resistivity normally differs among the drain region of high resistance in the Power MOS FET, high resistance region in the NPN transistor, and so on. An optimum resistivity value of the drain region having a high resistance in the power MOS FET should be about 1 Ω-cm, for instance, at $V_{DSS}=60$ V where $V_{DSS}$ represents a maximum drain-to-source voltage at the time of short-circuiting between the gate and source circuits of an associated transistor. On the other hand, an optimum resistivity value of the collector region having a high resistance in the NPN transistor should be about 6 Ω-cm, for instance at $V_{CEO}=60$ V where $V_{CEO}$ represents a maximum voltage between the collector and the emitter of an associated transistor with a base open-circuited. If the Power MOS FET and NPN transistor are integrated, as a Power-IC, in a single semiconductor substrate, when areas 3 and 8a are so formed as to have a resistivity value fitted for the NPN transistor, then the drain-to-source voltage $V_{DSS}$ of the power MOS FET becomes greater than necessary with the result that the ON resistance per unit area becomes much greater. Thus the area of the power MOS FET necessary to obtain a desired ON resistance becomes much greater when the power MOS FET and NPN transistor are integrated in a single semiconductor substrate than when the power MOS FET is formed as a discrete part, resulting in a poor yield. Where areas 3 and 8a are formed with a resistivity value suitable for the Power MOS FET, restriction is imposed on the collector-to-emitter voltage $V_{CED}$ of the NPN transistor, making it very difficult to achieve a circuit design involved.

If the control transistor element and the Power MOS FET having a drain region of high resistance are to be monolithically formed on a single semiconductor substrate, they are usually formed simultaneously, for example, by an epitaxial growth so that they have the same resistivity value. This resistivity value is properly selected in view of the characteristics of both the the control transistor element and the power MOS FET. In the conventional techniques it is very difficult to make the characteristics of the Power MOS FET within the aforementioned composite semiconductor device, such as the ON resistance and withstand voltage, equal to those of the Power MOS FET manufactured as a discrete element.

The application of this type of composite semiconductor devices has been quickly expanding and the demand for a wider characteristics window for each element integrated in the device has been increasing. Therefore is very important to optimize the design of the device as if each element integrated therein is mutually independent like a descrete element.

SUMMARY OF THE INVENTION

It is accordingly an object of the present invention to provide a composite semiconductor device which is manufactured by monolithically forming a Power MOS FET and control transistor elements in a single semiconductor device whereby the characteristics of such integrated elements, the power MOS FET in particular, are made substantially equal to the characteristics of the same elements in discrete form.

In the semiconductor device of the present invention, a Power MOS FET having a drain region of high resistance, as well as a corresponding control transistor element, is monolithically formed in a single semiconductor substrate whereby the resistivity value of a first area of the Power MOS FET, i.e., a drain region of high resistance is different from the resistivity value *of* a second area corresponding to the control transistor element.

In the composite semiconductor device of the present invention, the resistivity value of the first area of the power MOS FET, i.e., the drain region of high resistance and that of the second area, i.e., the control element can be made fitted for element formation. The characteristics of each of these element integrated in the device can be made substantially equal to the characteristics of the same element made in discrete form. The aforementioned feature of the present invention solve a problem associated with the conventional device, such as the problem of increase in the ON resistance of the Power MOS FET, which occurs due to the same resistivity involved between the high resistance drain region of the Power MOS FET and the control element in the conventional composite semiconductor device. Since the area of the Power MOS FET according to the present invention can be made smaller than that of the conventional semiconductor device, one of the advantages of the present invention over the convention device is that it is now possible to form semi-conductor elements in the device at a lower cost and higher yield.

BRIEF DESCRIPTION OF THE DRAWINGS

FIG. 6(a) and FIG. 6(b) are cross-sectional views showing a semiconductor device according to a fourth embodiment of the present invention;

FIG. 7(a) and FIG. 7(b) are cross-sectional views showing a semiconductor device according to a fifth embodiment of the present invention;

FIG. 8(a) to FIG. 8(f) are cross-sectional views showing a semiconductor device according to a sixth embodiment of the present invention;

DETAILED DESCRIPTION OF THE PREFERRED EMBODIMENTS

The embodiments of the present invention will now be explained below with reference to the accompanying drawings.

Figure 1:
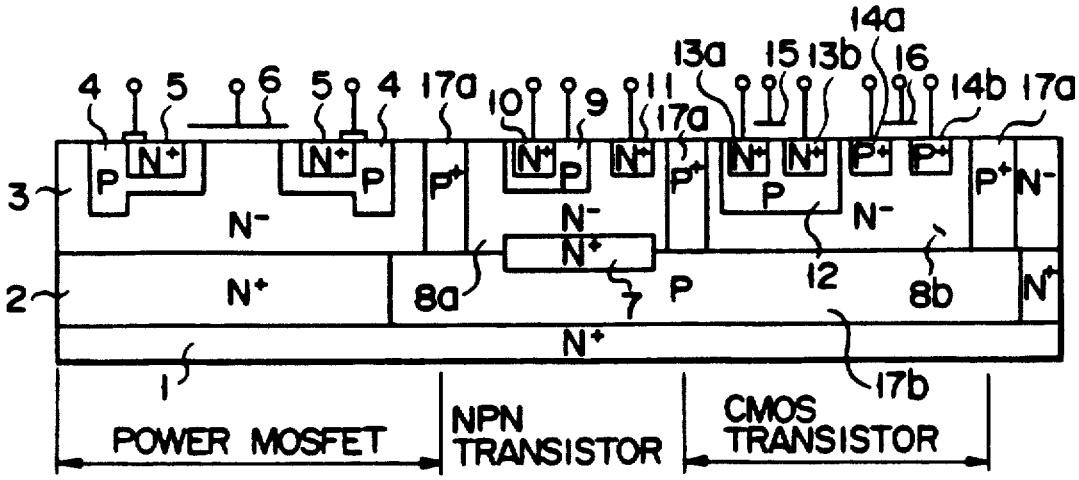
FIG. 1 (PRIOR ART)
FIG. 1 is a cross-sectional view showing a conventional semiconductor device.
Figure 2:
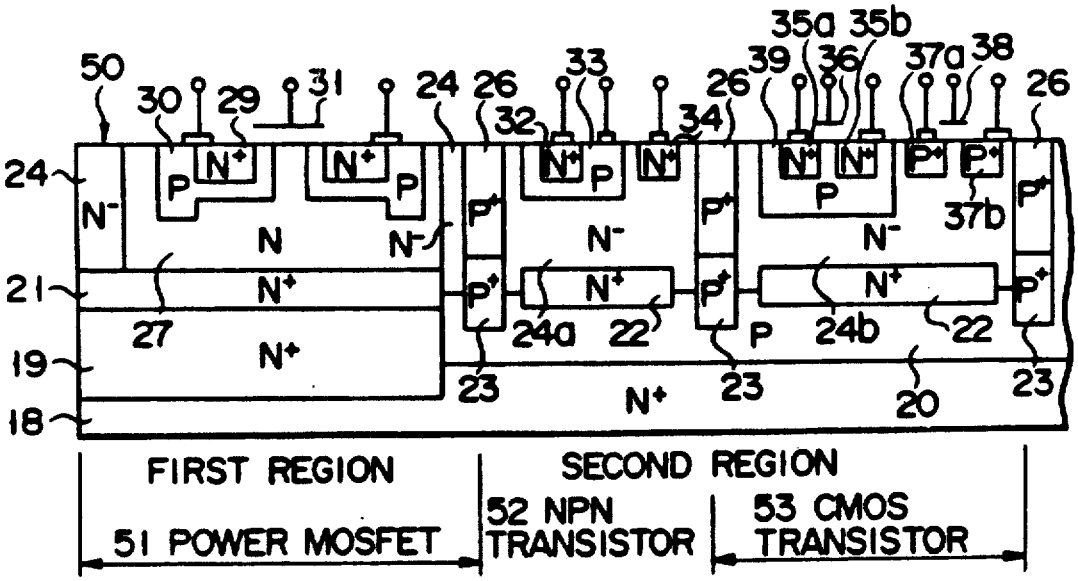
FIG. 2 is a cross-sectional view showing a semiconductor device according to a first embodiment of the present invention.

FIG. 2 is a cross-sectional view showing a semiconductor device according to a first embodiment of the present invention. Power MOS FET 51, NPN transistor 52 and CMOS transistor 53 used for controlling MOS FET 51 are all integrated in semiconductor substrate 50. A Power MOS FET 51 is formed in [a] *an* N−-type silicon 24 and comprises of high resistance drain area 27 (first area), a drain region having low resistance regions 18, 19 and 21, a P type body 30, [N30] *N+* type source region 29, and gate electrode 31. [A] *An* NPN transistor 52 used for controlling Power MOS FET 51 is formed within a high resistance N− type area 24a (second area) and comprises an emitter 32, a P type base 33, and [a] *an* N+ type collector 34. An N+ type collector 22 serves to lower the collector resistance. [An] *A* CMOS transistor 53 is formed within an N− type area 24b (second area) and comprises an N-channel MOS FET, which includes an N+ type drain 35e an, N+ type source 35b, and a gate electrode 36 formed within a P type well 39, and a P-channel MOS FET, which includes a P+ type drain 37a, a P+ type source 37b, and a gate electrode 38 formed within N− type area 24b. Power MOS FET 51, NPN transistor 52, and MOS transistor 53 are electrically isolated by a P type layer 20 and P+ type layers 23 and 26 (element isolation layers). In the first embodiment shown in FIG. 2, high resistance drain area 27 (first area) in Power MOS FET 51 has the resistivity value of about 1 Ω-cm and N-type areas 24a and 24b (second area) corresponding to control transistor elements 52 and 53 [has] *have* the resistivity value of 5 to 7 Ω-cm, these values being properly set in the formation of transistor elements.

Figure 3A:
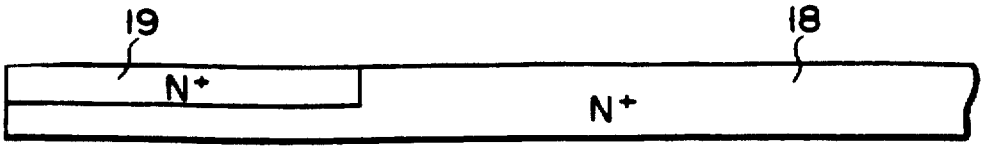
FIG. 3(a) to FIG. 3(f) show a process of manufacturing the semiconductor device shown in FIG. 2.
Figure 3B:
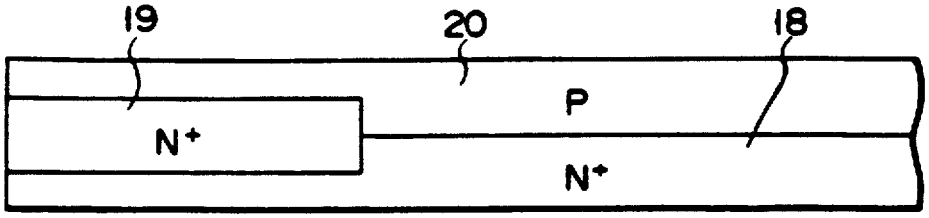
Figure 3C:
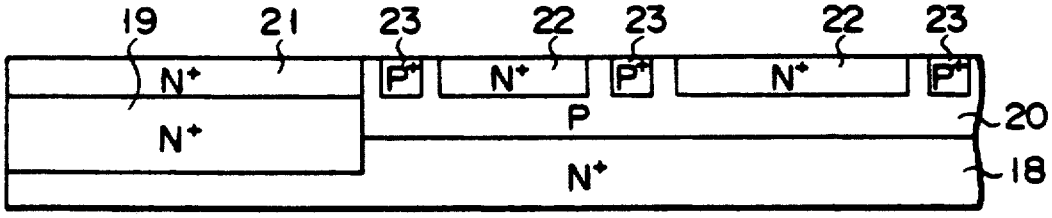
Figure 3D:
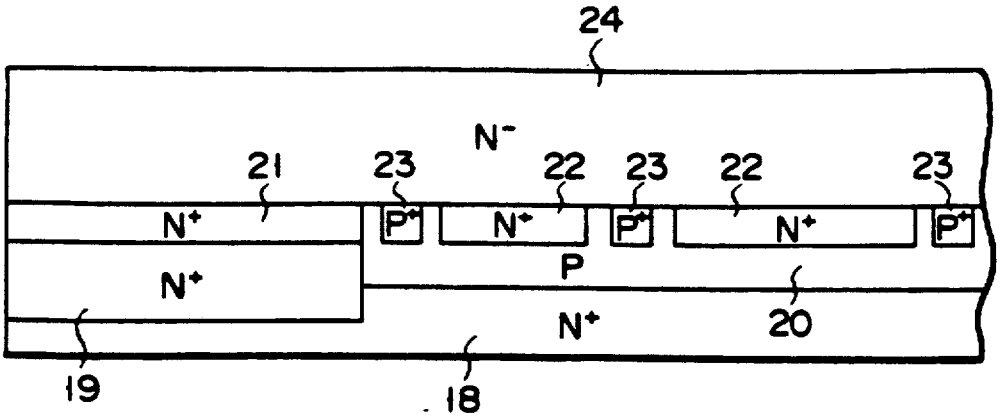
Figure 3E:
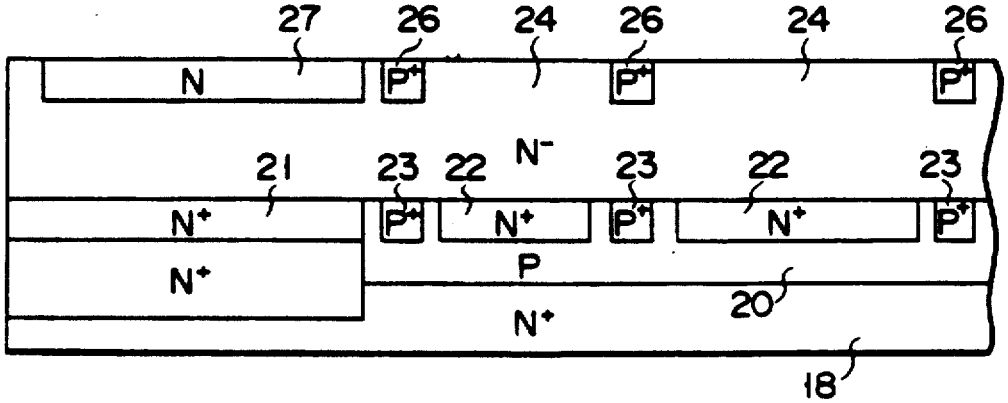
Figure 3F:
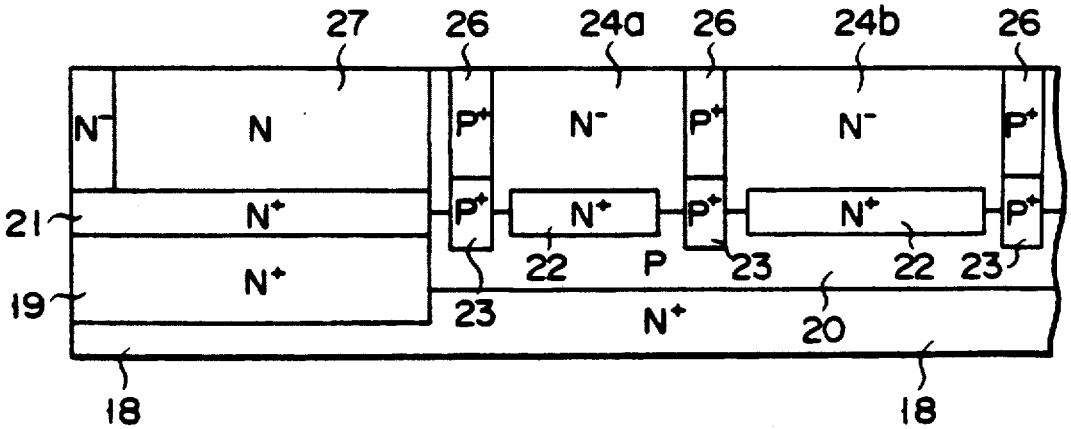

FIG. 3(a) to FIG. 3(f) are cross-sectional views showing a principal process in manufacturing the aforementioned semiconductor device of the present invention. An N+ type silicon substrate 18 of low resistance is prepared with a highly-concentrated antimony doped therein. A highly-concentrated phosphorus is diffused in a low-resistance drain formation section of a Power MOS FET in a gaseous atmosphere of $N_2$ and $O_2$ at 1000° to 1100° C. for 30 to 120 minutes to form N+ type region 19 as shown in FIG. 3(a). A P type silicon of 7 to 10 Ω (resistivity) is epitaxially grown on the surface of the resultant structure to form a P type silicon layer 20 (element isolation layer) about 20 or 30 μm in thickness and then thermally diffused in a gaseous atmosphere of $N_2$ and $O_2$ at 1100° to 1200° C. for 12 to 13 hours to form an N+ type region 19 as shown in FIG. 3(b). Antimony is diffused in the portion of the resultant structure in a gaseous atmosphere of $N_2$ at 1100° C. to 1200° C. for 20 to 120 minutes to form an N+ type region 21, corresponding to a low-resistance drain region in the Power MOS FET as well as a low-resistance area 22 used as a controlling element. A [P30] *P+* type impurity (boron) is diffused for 30 minutes in an element isolation area of a formation portion with a gaseous atmosphere of 1000° C. to 1100° C. to form element isolation a P+ type layer 23, as shown in FIG. 3(c). Then a N− type silicon layer 24 (phosphorus) is epitaxially grown on the resultant structure so as to have a desired resistivity value and thickness, as shown in FIG. 3(d). In the first embodiment of the present invention, an N− type silicon layer 24 (second layer) is formed which has the resistivity value of 5 to 7 Ω-cm and a thickness of 17 to 20 μm, suitable to the formation of an NPN transistor used for controlling a Power MOS FET. Then a phosphorus ion and an impurity concentration of $1\times10^{12}$ to $1\times10^{13}$ $cm^{-2}$ used to form an N type silicon area 27 are injected into the Power MOS FET formation section at an acceleration voltage of 100 keV. A P+ type impurity (boron) is diffused for four hours into an element isolation area of a formation portion with a gaseous atmosphere of $N_2$ at 1000° to 1100° C. to form an element isolation P+ type layer 26, as shown in FIG. 3(e). Thermal diffusion is achieved in a gaseous atmosphere of $N_2$ and $O_2$ at 1100° C. to 1200° C. for 8 hours, so that element isolation P+ layer 26 reaches an element isolation P+ type layer 23. In this way, island areas 24a, 24b are formed such that they are surrounded with $P^+$ type layers 23 and 26 and P type silicon layer 20. At this time, N type silicon area 27 extends in a depth direction, as shown in FIG. 3(f). Island areas 24a and 24b are formed as second areas corresponding to the control element in the substrate, and N type silicon area 27 is formed as a high resistance drain area (first area) in the Power MOS FET. In this embodiment, the phosphorus concentration and diffusion time are so selected as to be about 1 Ω-cm, a value suitable to the Power MOS FET at $V_{DSS}=60$ V. In this way, the Power MOS FET is formed in N type silicon area 27 and corresponding NPN transistor (control) 52 and CMOS transistor 53 are formed in $N^-$ type silicon areas 24a and 24b, respectively, as shown in FIG. 2.

In the first embodiment, epitaxial layer 24 which has a resistivity value suitable to the formation of NPN transistor (control) 52, is deposited as shown in FIG. 3(d), noting that second areas 24a, 24b are formed in epitaxial layer 24. Area 27 (first area) of Power MOS FET 51 in epitaxial layer 24 is set to have a proper resistivity value by means of an impurity diffusion method, as shown in FIG. (e) and FIG. (f).

Figure 4:
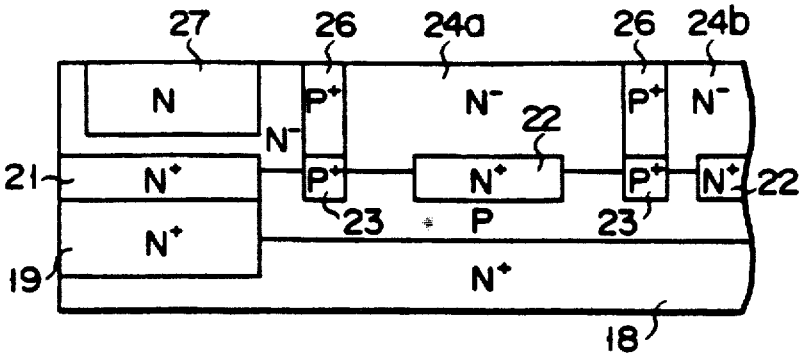
FIG. 4 is a cross-sectional view showing a semiconductor device according to a second embodiment of the present invention.

FIG. 4 is a cross-sectional view showing a semiconductor device according to a second embodiment of the present invention. In the first embodiment, N type silicon 27 (first area) reaches low resistance drain region 21 while, in the second embodiment, first area 27 may be of such a type that it does not reach region 21 in which case thermal diffusion is performed in a shorter time than in the first embodiment, as shown in FIG. 4, for example, for 5 hours in a gaseous atmosphere of $N_2$ and $O_2$ at 1100° to 1200° C.

Figure 5A:
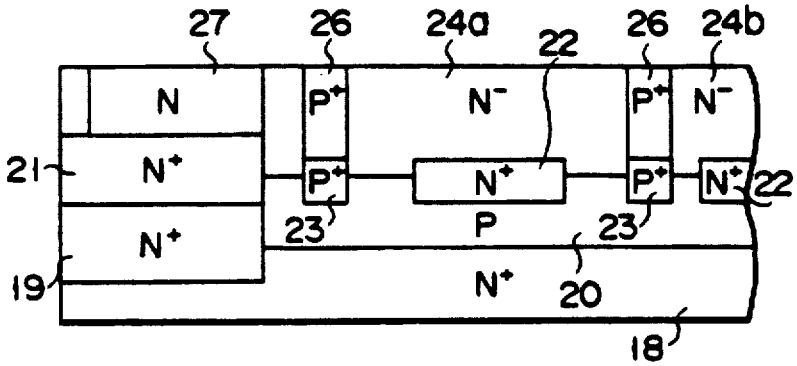
FIGS. 5(a) and FIG. 5(b) are cross-sectional views showing a third embodiment of the present invention.
Figure 5B:
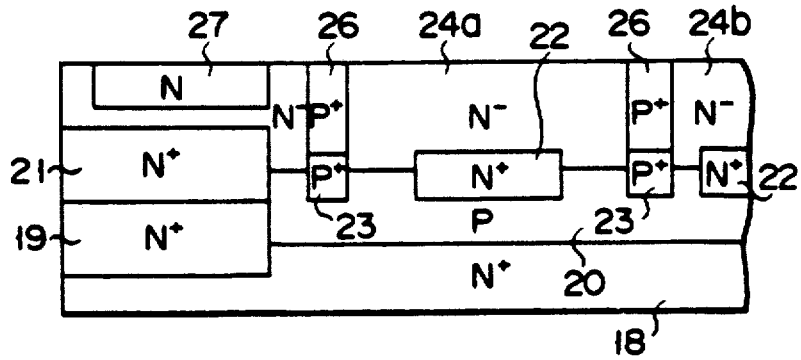

FIG. 5(a) and FIG. 5(b) are cross-sectional views showing a semiconductor device according to a third embodiment of the present invention. In the third embodiment, phosphorus is doped into a semiconductor structure to form a low resistance drain region 21 in a Power MOS FET and antimony is doped as an impurity in low a resistance collector region 22 in which case, due to a difference in the diffusion coefficient between the phosphorus and antimony, N an type silicon area 27 is made to be more shallow than a second area 24a. In FIG. 5(a), area 27 is of such a type that it reaches low resistance drain region 21 and, in FIG. 5(b), region 27 does not reach drain region 21.

Figure 6A:
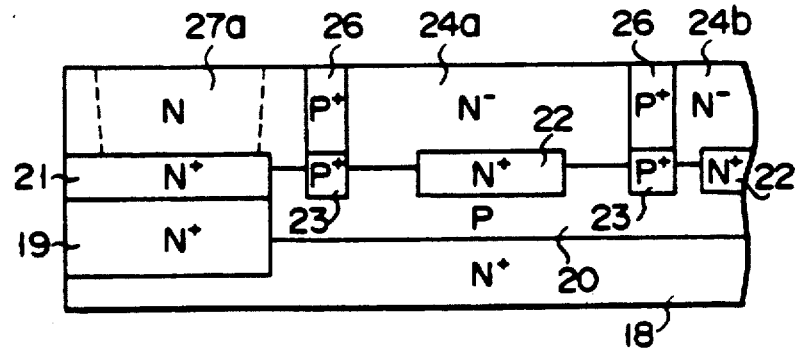

FIG. 6(a) and FIG. 6(b) are cross-sectional views showing a semiconductor device according to a fourth embodiment of the present invention. In the fourth embodiment, an area including a Power MOS FET is etched to a desired depth.

An N type silicon of a desired resistivity value is epitaxially grown onto that etched section to form an N type silicon area 27a, at which time the surface of the resultant structure is planarized.

In FIG. 6(a), region 27a is of such a type that it reaches a drain region 21 of low resistance and, in FIG. 6(b), region 27a does not reach drain region 21.

FIG. 7(a) and FIG. 7(b) show a fifth embodiment of the present invention. Although in the aforementioned embodiments the drain area of low resistance has been explained as having a varying resistivity value, it is also possible to vary the resistivity value of second area 24a in the control element section as the case may be. In FIG. 7(a), a control element formation area (second area) 24a is so formed through impurity diffusion as to be made different in resistivity from a Power MOS FET formation area. In FIG. 7(b), the second area is selectively etched in the semiconductor structure and a layer is epitaxially grown on the corresponding area of the semiconductor structure so as to be made different in resistivity from the Power MOS FET formation area.

FIG. 8(a) to FIG. 8(f) are cross-section views showing a semiconductor device according to a sixth embodiment of the present invention. In connection with the first to fifith embodiments, an explanation has been made of the semiconductor device in which a source current of a Power MOS FET is taken out from a first major surface side (the upper surface side) of the semiconductor substrate and a drain current from a second major surface side (the lower surface side) of the semiconductor substrate.

Figure 8B:
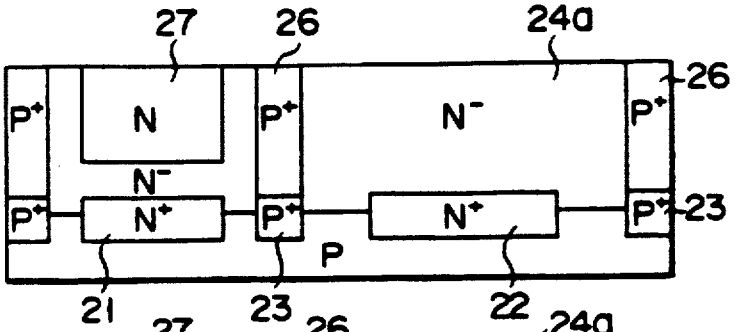
Figure 8C:
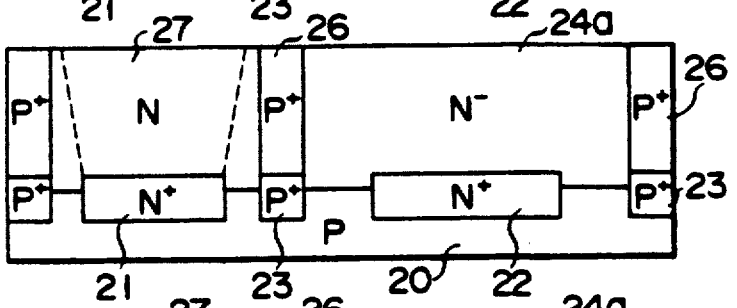
Figure 8D:
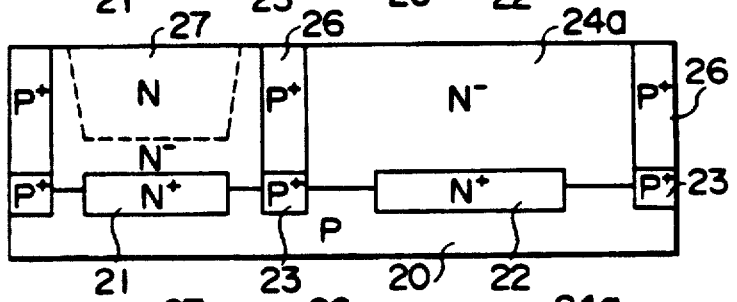
Figure 8E:
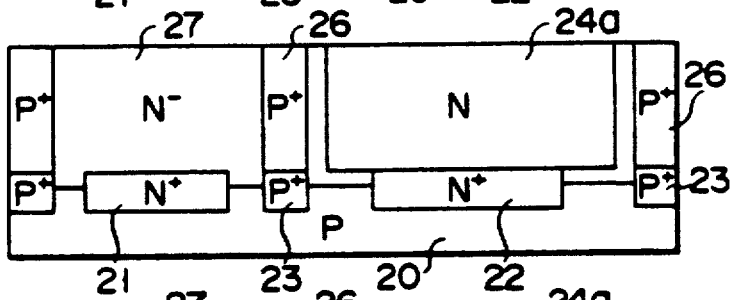
Figure 8F:
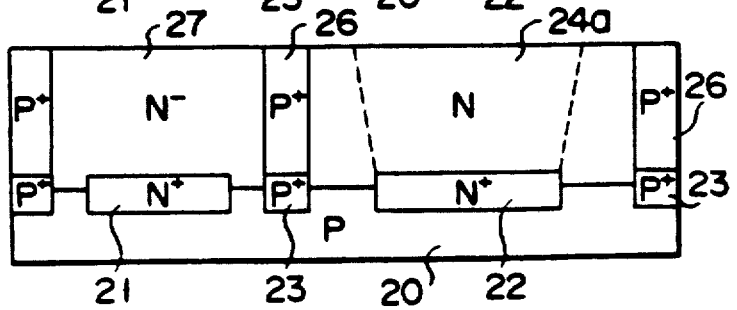

In the embodiment shown in FIG. 8(a) through FIG. 8(f), source and drain currents of the Power MOS FET are taken from a first major surface side of the semiconductor substrate. In the embodiment shown in FIG. 8(a) through 8(f) similar reference numerals are employed to designate parts or elements corresponding to those shown in the embodiment of FIG. 2. Reference numeral 40 shows an $N^+$ drain region for taking out the drain current of the Power MOS FET. The semiconductor device is of such a type that the drain area (first area) of high resistance is so formed as to be made different in resistivity from control element formation areas 24a, 24b (second area) and that area 27 reaches the drain region of low resistance. FIG. 8(b) shows a modified form of a semiconductor device in which the first area is so formed through impurity diffusion as to be made different in resistivity from areas 24a, 24b and that the first area does not reach drain region 21 of low resistivity. FIG. 8(c) shows a semiconductor device in which, after the etching of the first area, a layer is epitaxially grown on the surface of the resultant semiconductor structure such that it reaches a drain region 21 of low resistance with the former made different in resistivity from the latter. FIG. 8(d) shows a form of semiconductor device in which after the etching of the first area a layer is epitaxially grown on the surface of the resultant structure such that it does not reach the drain region of low resistance. FIG. 8(e) shows a semiconductor device in which a second region is so formed through impurity diffusion as to vary its resistivity value and FIG. 8(f) shows a semiconductor device in which a second area varies its resistivity value by an etching step and epitaxially growing step. Although, in order to make the first and second areas different in resistivity from each other, the $N^-$ type area of high resistance having a lower impurity concentration is converted to the N type area of high impurity concentration in the aforementioned embodiments, the N type area may be changed to the $N^-$ type area either by varying their resistivity values through the diffusion of an impurity of the opposite conductivity type or by etching the N type area and epitaxially growing an $N^-$ type silicon layer of a lower impurity concentration.

Figure 9:
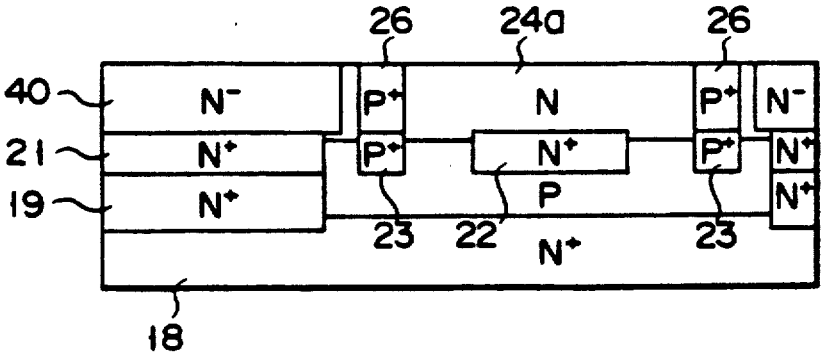
FIG. 9 is a cross-sectional view showing a semiconductor device according to a seventh embodiment of the present invention.

FIG. 9 is a cross-sectional view showing a semiconductor device according to a seventh embodiment of the present invention. In the seventh embodiment, after the formation of N type epitaxial layer 24 (see FIG. 3), an impurity (boron) of the other conductivity type is diffused into area 27 (shown in FIG. 2) in a Power MOS FET to form N type area 27 (shown in FIG. 2) an $N^-$ type region 40.

The present invention can also be applied to a Power MOS FET in another element isolation structure.

Figure 10:
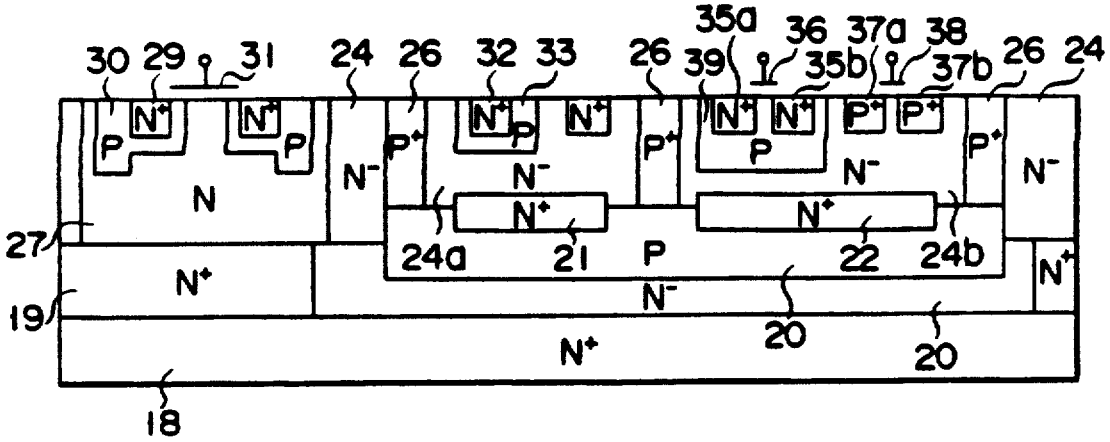
FIG. 10(a) to FIG. 10(c) are cross-sectional views showing a semiconductor device according to a tenth embodiment of the present invention.
Figure 10:
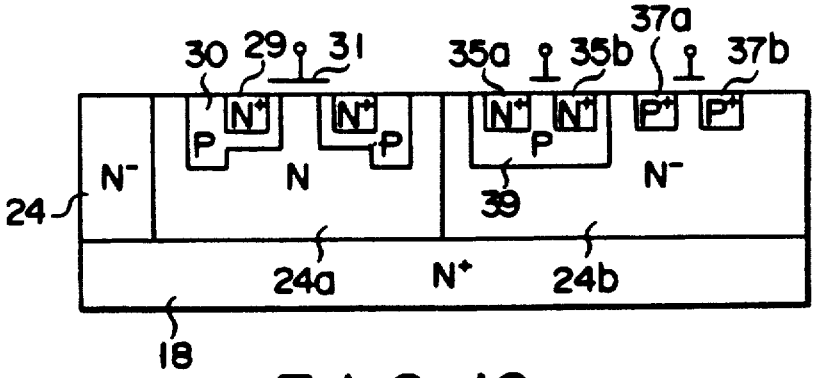
Figure 10:
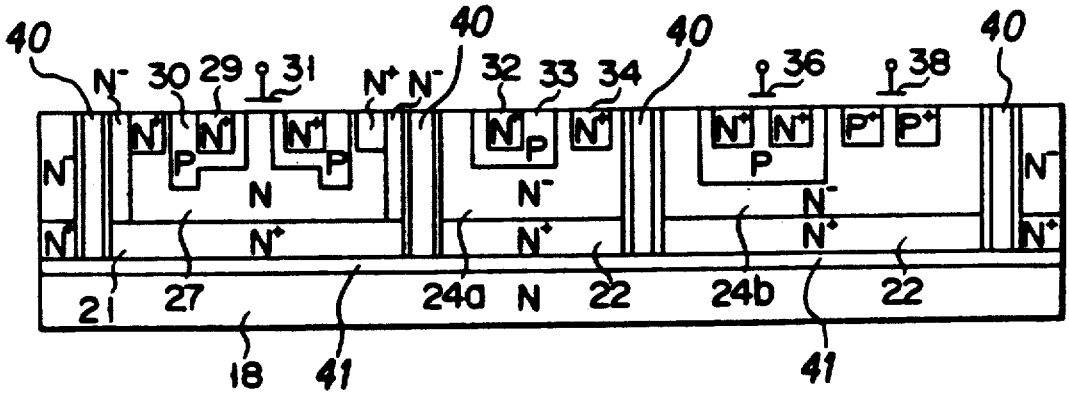

FIG. 10(a) to FIG. 10(c) show a tenth embodiment of the present invention, that is, a device fabricated by a PN isolation method, device fabricated by a self isolation method and device fabricated by a dielectric isolation method, respectively. In FIG. 10(a), numeral 37a denotes P+ type drain, numeral 37b denotes [$P^{30}$] P+ type source. In FIG. 10(c), numeral 40 denotes dielectric region, and numeral 41 denotes oxide layers.

What is claimed is:

1. A semiconductor device comprising:

a power gate-insulated MOS field effect transistor having a drain region and a control circuit element formed on a common semiconductor substrate, said drain region having a high and a low resistance region, said high resistance region overlaying said low resistance region;

a first area including at least a portion of said high resistance region of the drain region of the power gate-insulated MOS field effect transistor, said first area having a predetermined resistivity value; and a second area including at least a portion of the area in which said control circuit element is formed, said second area being disposed contiguous to said first area, said second area having a resistivity value less than said predetermined resistivity value of the first area.

2. A semiconductor device according to claim 1, wherein said power gate-insulated MOS field effect transistor has a source current taken from a first major surface side of said semiconductor substrate and has a drain current taken from a second major surface side of said semiconductor substrate, the second major surface side being disposed opposite said first major surface side.

3. A semiconductor device according to claim 1, wherein said power gate-insulated MOS field effect transistor has a source current and a drain current taken from a major surface side of said semiconductor substrate.

4. A semiconductor device according to claim 1, wherein said first area is formed by selectively etching at least a portion of the area that includes said power gate-insulated MOS field effect transistor, and epitaxially growing a layer in said etched portion of the area.

5. A semiconductor device according to claim 1, wherein said second area is formed by selectively etching at least a portion of the area occupied by said control circuit element, and epitaxially growing a layer in said etched portion of the area.

6. A semiconductor device according to claim 1, wherein one of said first and second areas is impurity-diffused for providing different resistivity values to the first and second areas.

7. A semiconductor device according to claim 1, wherein said first area is in contact with said low resistance region of said drain region.

8. A semiconductor device according to claim 1, wherein said first area is not in contact with said low resistance region of said drain region.

9. A semiconductor device according to claim 1, wherein the depth defined by a dimension substantially perpendicular to a major surface of the semiconductor substrate of the first area is substantially smaller than the depth of the second area.

10. A semiconductor device according to claim 1, wherein said first area has an impurity concentration gradient extending into the semiconductor substrate from a major surface thereof in a direction perpendicular to said major surface.

*11. A semiconductor device comprising:*

*a power gate-insulated MOS field effect transistor having a drain region and a control circuit element formed on a common semiconductor substrate, said drain region having a high and a low resistance region, said high resistance region overlying said low resistance region;*

*a first area including at least a portion of said high resistance region of the drain region of the power gate-insulated MOS field effect transistor, said first area having a predetermined resistivity; and*

*a second area including at least a portion of the area in which said control circuit element is formed, said second area being disposed contiguous to said first area, said second area having a resisitivity different from said predetermined resistivity of the first area.*

*12. A semiconductor device according to claim 11, wherein said power gate-insulated MOS field effect transistor has a source current taken from a first major surface side of said semiconductor substrate and has a drain current taken from a second major surface side of said semiconductor substrate, the second major surface side being disposed opposite said first major surface side.*

*13. A semiconductor device according to claim 11, wherein said power gate-insulated MOS field effect transistor has a source current and a drain current taken from a major surface side of said semiconductor substrate.*

*14. A semiconductor device according to claim 11, wherein said first area is formed by selectively etching at least a portion of the area that includes said power gate-insulated MOS field effect transistor, and epitaxially growing a layer in said etched portion of the area.*

*15. A semiconductor device according to claim 11, wherein said area is formed by selectively etching at least a portion of the area occupied by said control circuit element, and epitaxially growing a layer in said etched portion of the area.*

*16. A semiconductor device according to claim 11, wherein one of said first and second areas is impurity diffused for providing different resistivity values to the first and second areas.*

*17. A semiconductor device according to claim 11, wherein said first area is in contact with said low resistance region of said drain region.*

*18. A semiconductor device according to claim 1, wherein said first area is not in contact with said low resistance region of said drain region.*

*19. A semiconductor device according to claim 11, wherein the depth defined by a dimension substantially perpendicular to a major surface of the semiconductor substrate of the first area is substantially smaller than the depth of the second area.*

*20. A semiconductor device according to claim 11, wherein said first area has an impurity concentration gradient extending into the semiconductor substrate from a major surface thereof in a direction perpendicular to said major surface.*

* * * * *